US007002128B2

(12) United States Patent
Hedin et al.

(10) Patent No.: US 7,002,128 B2
(45) Date of Patent: Feb. 21, 2006

(54) LASER DIODE DRIVING CIRCUIT WITH SAFETY FEATURE

(75) Inventors: Daniel Scott Hedin, Rochester, MN (US); Matthew James Paschal, Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 83 days.

(21) Appl. No.: 10/640,995

(22) Filed: Aug. 14, 2003

(65) Prior Publication Data

US 2004/0099788 A1 May 27, 2004

Related U.S. Application Data

(60) Provisional application No. 60/403,368, filed on Aug. 15, 2002.

(51) Int. Cl.
*G01J 1/32* (2006.01)

(52) U.S. Cl. ................................ 250/205; 372/29.014

(58) Field of Classification Search ................ 250/205; 327/514; 315/150–159; 372/38.07, 12, 372/29.014, 29.01, 29.02
See application file for complete search history.

(56) References Cited

U.S. PATENT DOCUMENTS

| | | | | |
|---|---|---|---|---|
| 5,015,836 | A | 5/1991 | Van Antwerp | |
| 5,850,409 | A * | 12/1998 | Link | 372/38.01 |
| 6,049,073 | A * | 4/2000 | Roddy et al. | 250/205 |
| 6,208,152 | B1 | 3/2001 | Baumgartner et al. | |
| 6,392,215 | B1 | 5/2002 | Baumgartner et al. | |
| 6,792,020 | B1 * | 9/2004 | Romm | 372/38.09 |

* cited by examiner

*Primary Examiner*—David Porta
*Assistant Examiner*—Patrick J. Lee
(74) *Attorney, Agent, or Firm*—Allen, Dyer, Doppelt, Milbrath & Gilchrist, P.A.

(57) ABSTRACT

The invention relates to a feedback loop for a laser diode driving circuit for ensuring that the laser diode generates optical power at a constant safe level. The feedback loop includes a monitor diode, which generates a monitor current $I_{mon}$, and a set resistance for generating a set voltage based on the monitor current and the set resistance. The set voltage is compared with a reference voltage in an operational amplifier, which generates a control signal for controlling the laser diode current source. The laser diode current source dictates the amount of bias current transmitted to the laser diode. Safety features, in the form of voltage comparators, are provided to ensure that: a) the feedback loop is closed, i.e. $I_{mon}$ is not too low; b) the optical power is not above standard safety threshold, i.e. $I_{mon}$ is not too high; and c) the monitor diode voltage is sufficient to provide specified optical power to electrical power conversion.

10 Claims, 4 Drawing Sheets

LASER DIODE DRIVING CIRCUIT WITH SAFETY FEATURE

CROSS-REFERENCE TO RELATED APPLICATIONS

The present invention claims priority from U.S. patent application Ser. No. 60/403,368 filed Aug. 15, 2002.

TECHNICAL FIELD

The present invention relates to a laser diode driving circuit, and in particular to a laser diode drive circuit utilizing voltage comparators for setting the laser power and providing safety features.

BACKGROUND OF THE INVENTION

Conventional laser diode drive circuits, such as the one disclosed in U.S. Pat. No. 6,392,215 issued May 21, 2002 in the name of Baumgartner et al and illustrated in FIG. 1, utilize a feedback loop 10 to control the bias current $I_{laser}$, which drives the laser diode 12. The feedback loop 10 includes a monitor diode 16, which produces a monitor current $I_{mon}$ proportional to the power output of the laser diode 12. The monitor current $I_{mon}$ is mirrored via current mirror 18, which is comprised of transistors 26 and 28, and compared to a predetermined reference current $I_{ref}$, which is generated by current source 22, and the result of this comparison is fed via lead 32 to an operational amplifier 20, which outputs a bias control signal 30. The bias control signal 30 directs a bias current source 14 to raise, lower or maintain the bias current $I_{laser}$ depending on whether more, less or the same amount of power is required from the laser diode 12. A compensating capacitor 24 is provided for filtering power supply noise. Unfortunately, the design of current comparators can be relatively complicated. Moreover, the prior art drive circuits do not include safety features to protect against unsafe levels of laser power, particularly redundant safety features dependent upon various electrical signals used in the drive circuit to ensure laser diode shutdown when undesired levels are detected.

An object of the present invention is to overcome the shortcomings of the prior art by providing a laser diode driving circuit utilizing voltage comparators instead of current comparators.

Another object of the present invention is to provide a laser diode driving circuit with safety features for ensuring that the laser diode operates within standard safety limits.

SUMMARY OF THE INVENTION

Accordingly, the present invention relates to a driving circuit for driving a laser diode comprising:

an optical power monitor for generating a monitor current indicative of output optical power from the laser diode;

a set resistor for generating a set voltage based on the monitor current;

an operational amplifier having a first input coupled to a main reference voltage and a second input for receiving the set voltage, the operational amplifier for generating an output signal indicative of a comparison between the first and second inputs;

a variable current source coupled to an output of said operational amplifier, and coupled to said laser diode for biasing said laser diode, whereby the operational amplifier adjusts the output signal thereof to ensure that the set voltage and the main reference voltage are substantially equal;

first comparator means for comparing the set voltage with a first safety reference voltage, whereby when the set voltage is substantially less than the first safety reference voltage a first fault signal is generated; and shut down means for shutting down the laser diode in response to receiving the first fault signal.

Another aspect of the present invention relates to a driving circuit for driving a laser diode comprising:

an optical power monitor for generating a monitor current indicative of output optical power from the laser diode;

a set resistor for generating a set voltage based on the monitor current;

an operational amplifier having a first input coupled to a main reference voltage and a second input for receiving the set voltage, the operational amplifier for generating an output signal indicative of a comparison between the first and second inputs;

a variable current source coupled to an output of said operational amplifier, and coupled to said laser diode for biasing said laser diode, whereby the operational amplifier adjusts the output signal thereof to ensure that the set voltage and the main reference voltage are substantially equal;

test resistance means for generating a test voltage based on the monitor current;

first comparator means for comparing the test voltage to a second safety reference voltage, whereby when the test voltage is substantially greater than the second safety reference voltage a first fault signal is generated; and shut down means for shutting down the laser diode in response to receiving the first fault signal.

Another feature of the present invention relates to a driving circuit for driving a laser diode comprising:

an optical power monitor for generating a monitor current indicative of output optical power from the laser diode;

a set resistor for generating a set voltage based on the monitor current;

an operational amplifier having a first input coupled to a main reference voltage and a second input for receiving the set voltage, the operational amplifier for generating an output signal indicative of a comparison between the first and second inputs;

a variable current source coupled to an output of said operational amplifier, and coupled to said laser diode for biasing said laser diode; whereby the operational amplifier adjusts the output signal thereof to ensure that the set voltage and the main reference voltage are substantially equal;

a first comparator for comparing voltage across the monitor diode with a first safety reference voltage, whereby when the voltage on the monitor diode's anode is substantially greater than the first safety reference voltage a fault signal is generated; and logic means for shutting down the laser diode if the fault signal are generated.

BRIEF DESCRIPTION OF THE DRAWINGS

The invention will be described in greater detail with reference to the accompanying drawings, which represent preferred embodiments thereof, wherein.

DETAILED DESCRIPTION

Figure 1:
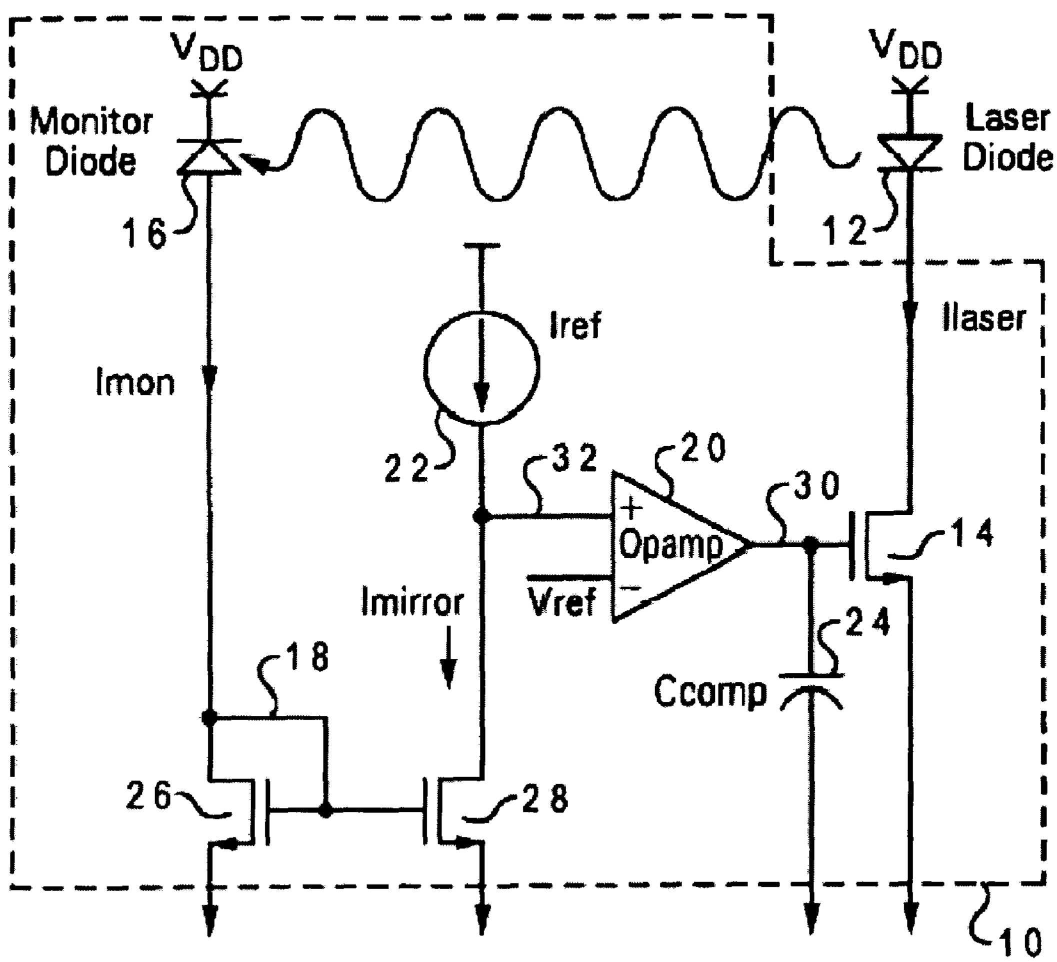
FIG. 1 is a conventional laser diode driving circuit.
Figure 2:
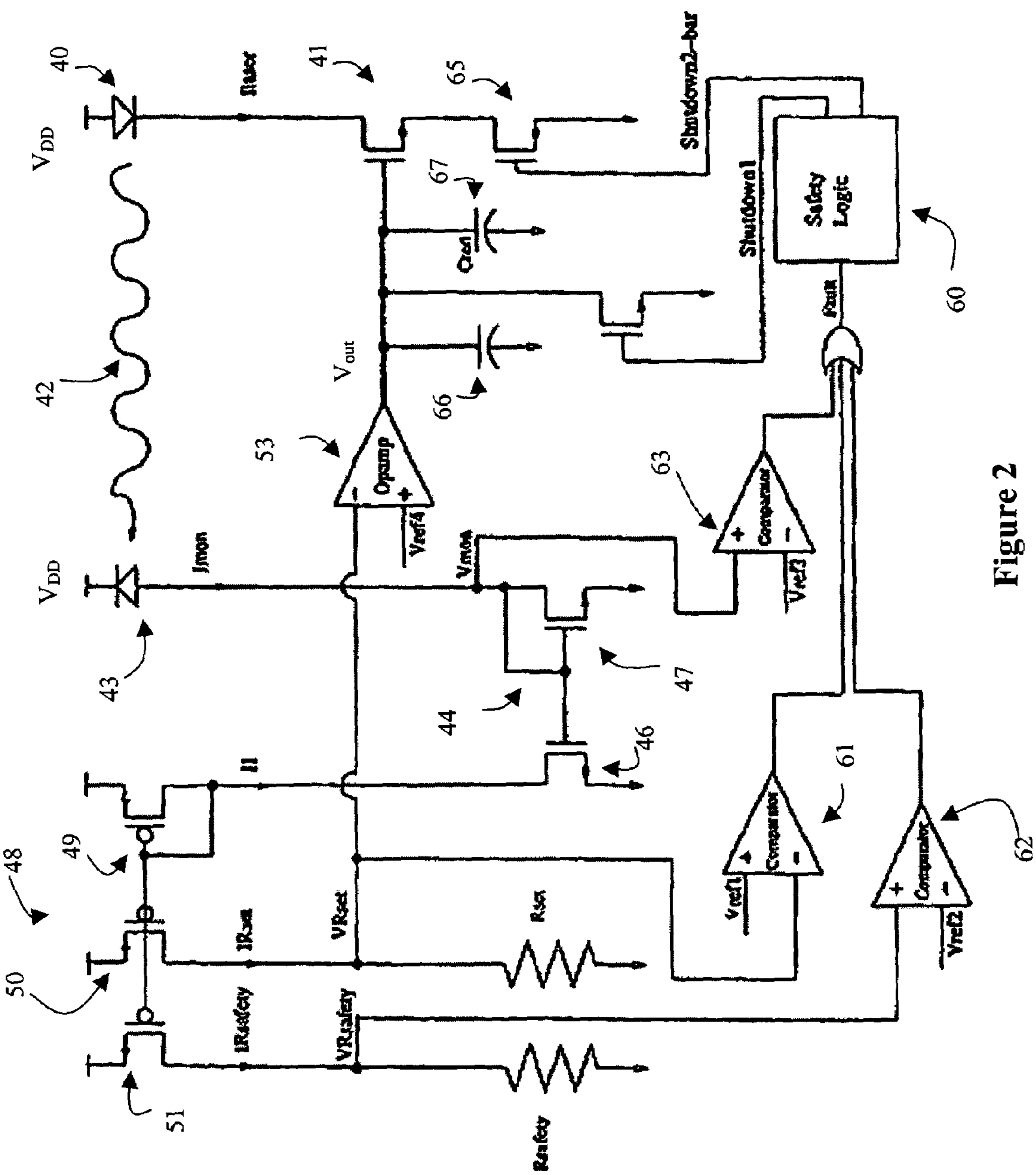
FIG. 2 is a laser diode driving circuit according to the present invention.

With reference to FIG. 2, a laser diode 40 is coupled to a voltage source $V_{DD}$ and a current source 41, in the form of a NFET. For the purposes of a feedback loop, a portion 42 of the light launched from the laser diode 40 is directed at a monitor diode 43, which generates a monitor current $I_{mon}$ proportional to the optical power produced by the laser diode 40. The monitor current $I_{mon}$ is fed to a first current mirror 44, which produces a mirror current $I_1$ substantially equal to $I_{mon}$. The current mirror 44, which has a low impedance, is provided to ensure that the monitor diode node is a non-dominant pole in the feedback loop. The first current mirror 44 is comprised of two transistors 46 and 47, with their gates electrically coupled together. The mirror current $I_1$ is fed to a second current mirror 48, which produces safety current $I_{Rsafety}$ and set current $I_{Rset}$. The second current mirror 48 is comprised of three transistors 49, 50 and 51, with their gates electrically coupled together. A set resistor $R_{set}$ is provided to generate a set voltage $V_{Rset}$, which is fed into an operational amplifier 53. It is possible to utilize one current mirror rather than the two illustrated, depending on which polarity of monitor diode is used; however, it is desirable to have the set resistor $R_{set}$ go to ground for power supply noise reasons. The operational amplifier 53 compares the set voltage $V_{Rset}$ to a main reference voltage $V_{ref4}$. The output voltage $V_{out}$ of the operational amplifier 53 is fed to the gate of the current source 41, thereby completing the feedback loop. Since the operational amplifier 53 adjusts the output $V_{out}$ to ensure that the two input voltages are substantially equal, the resistor $R_{set}$ and the main reference voltage $V_{ref4}$ determine how much monitor current $I_{mon}$ will be required to satisfy the feedback loop. In other words the operational amplifier 53 will adjust the output $V_{out}$ to ensure that the current source 41 provides a sufficient amount of bias current $I_{laser}$, whereby $I_{mon} \times R_{set} \sim V_{ref4}$.

Figure 3:
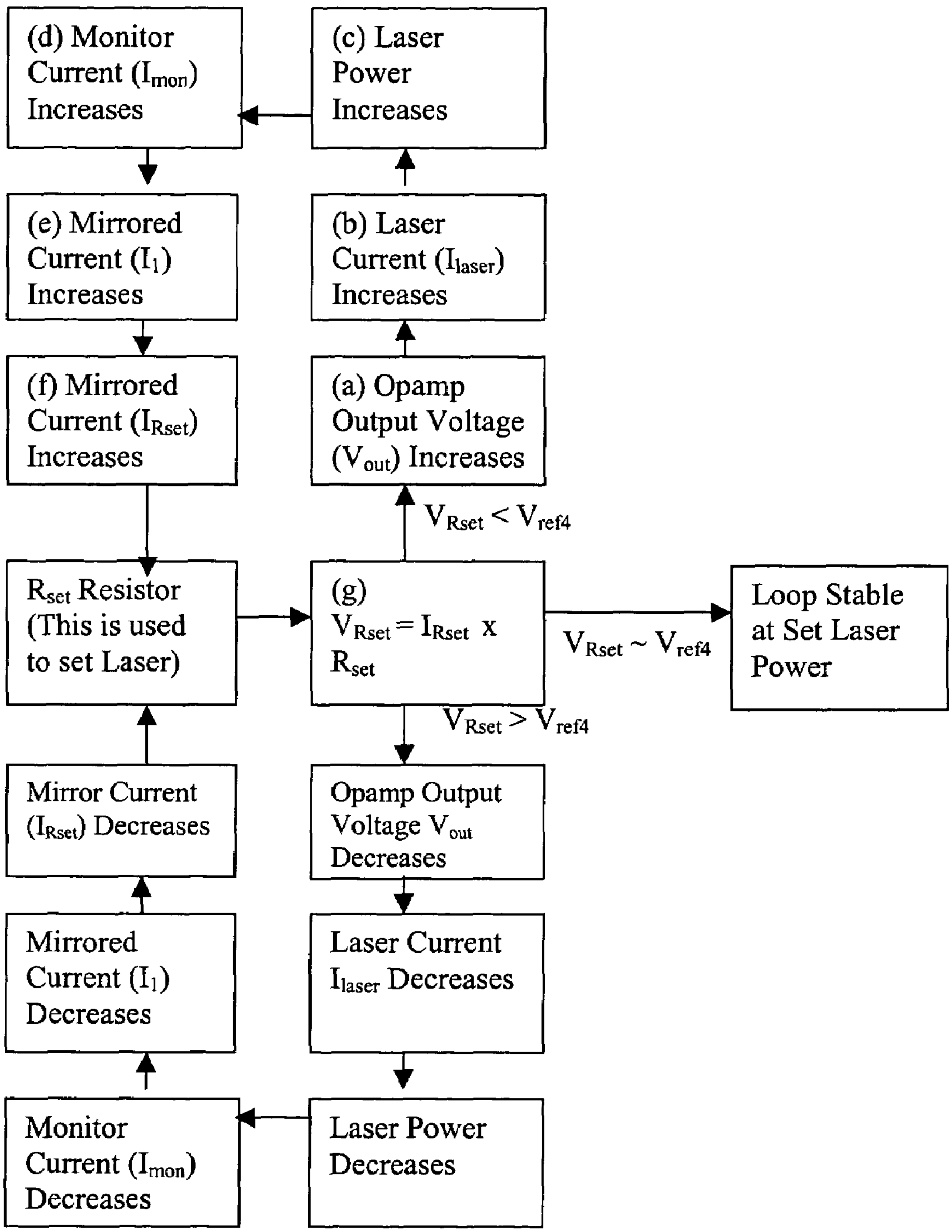
FIG. 3 is a flowchart illustrating the feedback loop according to the laser diode driving circuit of FIG. 2.

The flow chart in FIG. 3 details the steps taken by the feedback loop in the event that the $V_{Rset} > V_{ref4}$ and when $V_{Rset} < V_{ref4}$. For example, if $V_{Rset} < V_{ref4}$, then a) the output $V_{out}$ from the operational amplifier 53 will increase, b) the laser current $I_{laser}$ will increase, c) the laser power will increase, d) the monitor current $I_{mon}$ will increase, e) the mirror current $I_1$ will increase, f) the mirrored current $I_{Rset}$ will increase, and g) the $V_{Rset}$ will increase. These steps are repeated again if $V_{Rset}$ is still less than $V_{ref4}$.

Safety features, under control of a Safety Logic control 60, are provided to ensure that the laser power does not exceed standard safety limits. First, to ensure that the feedback loop is closed, the voltage $V_{Rset}$ across the resistor $R_{set}$ is compared to a first safety reference voltage $V_{ref1}$ in a first comparator 61. If the feedback loop is not closed, i.e. $V_{Rset}$ is substantially less than the second reference voltage $V_{Ref1}$, a fault will be indicated to the Safety Logic 60, and the laser 40 will be shutdown.

The second current mirror 48 also mirrors $I_1$ into $I_{Rsafety}$, which, along with $R_{safety}$, produces voltage $V_{Rsafety}$. A second comparator 62 is provided to compare the voltage $V_{Rsafety}$ with a second safety reference voltage $V_{ref2}$. If the voltage $V_{Rsafety}$ goes substantially above the second safety reference voltage $V_{ref2}$, which indicates the monitor current $I_{mon}$ and therefore the laser power has risen sharply, a fault will be indicated to the Safety Logic 60, and the laser 40 will be shutdown.

The voltage $V_{mon}$ across the monitor diode 43 is also monitored to ensure that a certain reverse bias is provided, thereby guaranteeing a specified optical to electrical conversion. Accordingly, if a third comparator 63 indicates that the monitor diode voltage $V_{mon}$ is substantially more than a third safety reference voltage $V_{ref3}$, i.e. the monitor diode reverse voltage is too small, a fault will be indicated to the Safety Logic 60, and the laser 40 will be shutdown.

The outputs of the first, second and third comparators 61, 62 and 63 are logically OR'ed together and sent to the Safety Logic 60; therefore, if any one of the comparators indicates a fault, then the system will be shutdown. In response to a fault signal, the Safety Logic 60 sends a pair of redundant shutdown signals. The first shutdown signal turns off a switch 65, connected to the source of the current source 41. The second shutdown signal pulls down the output $V_{out}$ from the operational amplifier 53 causing the laser current $I_{laser}$ to turn off.

Figure 4:
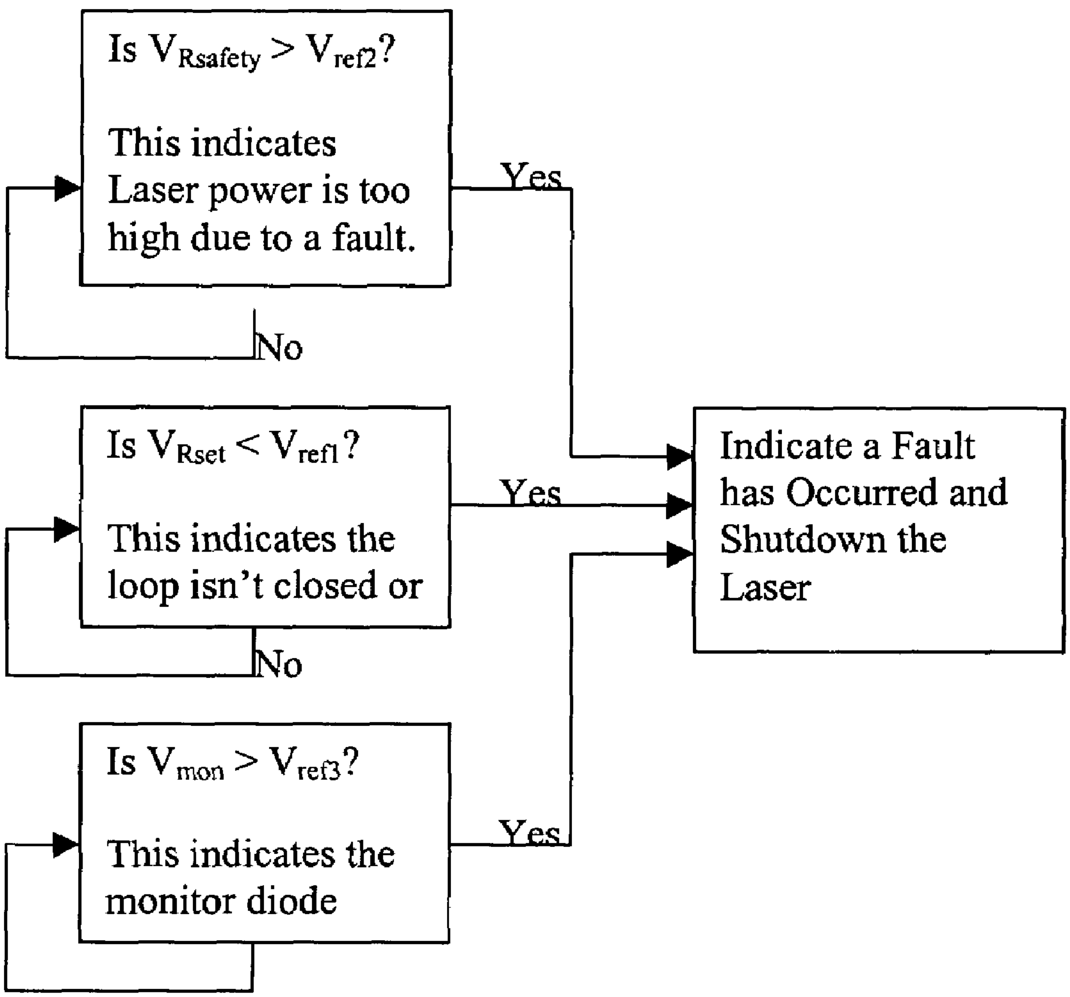
FIG. 4 is a flowchart illustrating the safety features according to the laser diode driving circuit of FIG. 2.

The flowchart, illustrated in FIG. 4, details the comparisons made by the first, second and third comparators 61, 62 and 63.

A compensating capacitor 66 is provided at an output node of the operational amplifier 53 to filter out any noise, particularly power supply noise. The output of the operational amplifier 53 is the ideal position in order to maximize the AC power supply rejection ratio (PSRR). The operational amplifier 53 is designed to have a high impedance output to help with the AC PSRR, and to make the output node the dominant pole in the feedback loop.

A redundant capacitor 67 is also provided in parallel to the compensating capacitor 66 for safety purposes in the event that the compensating capacitor 66 fails.

We claim:

1. A driving circuit for driving a laser diode comprising:

an optical power monitor for generating a monitor current indicative of output optical power from the laser diode;

a set resistor for generating a set voltage based on the monitor current;

an operational amplifier having a first input coupled to a main reference voltage and a second input for receiving the set voltage, the operational amplifier for generating an output signal indicative of a comparison between the first and second inputs;

a variable current source coupled to an output of said operational amplifier, and coupled to said laser diode for biasing said laser diode, whereby the operational amplifier adjusts the output signal thereof to ensure that the set voltage and the main reference voltage are substantially equal;

first comparator means for comparing the set voltage with a first safety reference voltage, whereby when the set voltage is substantially less than the first safety reference voltage a first fault signal is generated;

a monitor diode comparator for comparing voltage across the monitor diode with a monitor diode safety reference voltage, whereby when the voltage on the monitor diode's anode is substantially greater than the monitor diode safety reference voltage a monitor diode fault signal is generated for shutting off the laser diode;

shut down means for shutting down the laser diode in response to receiving the first fault signal or the monitor diode fault signal; and logic means for sending a signal to the shut down means for shutting down the laser diode if either of the first or the mointor diode fault signals is generated.

2. The driving circuit according to claim 1, further comprising a first current mirror coupled to the optical power monitor for generating a first mirror current based on the monitor current; wherein said first mirror current, along with the set resistor, is used for generating the set voltage.

3. The driving circuit according to claim 1, further comprising:

test resistance means for generating a test voltage based on the monitor current;

second comparator means for comparing the test voltage to a second safety reference voltage, whereby when the test voltage is substantially greater than the second safety reference voltage a second fault signal is generated; and logic means for sending a signal to the shut down means for shutting down the laser diode if either of the first or the second fault signals is generated.

4. The driving circuit according to claim 3, further comprising a second current mirror for generating a second mirror current based on the monitor current; wherein said second mirror current, along with the test resistor, is used for generating the test voltage.

5. The driving circuit according to claim 1, wherein the shut down means includes independent first and second shutdown means.

6. The driving circuit according to claim 5, wherein the first shutdown means includes a switch for shutting off the current source.

7. The driving circuit according to claim 5, wherein the second shutdown means reduces the output signal from the operational amplifier until the current source shuts off.

8. The driving circuit according to claim 3, wherein the shut down means includes independent first and second shutdown means.

9. The driving circuit according to claim 8, wherein the first shutdown means includes a switch for shutting off the current source.

10. The driving circuit according to claim 8, wherein the second shutdown means reduces the output signal from the operational amplifier until the current source shuts off.

* * * * *

UNITED STATES PATENT AND TRADEMARK OFFICE

CERTIFICATE OF CORRECTION

PATENT NO. : 7,002,128 B2
APPLICATION NO. : 10/640995
DATED : February 21, 2006
INVENTOR(S) : Hedin et al.

It is certified that error appears in the above-identified patent and that said Letters Patent is hereby corrected as shown below:

Col. 4, line 65, “the mointor diode” should read -- the monitor diode --

Signed and Sealed this

First Day of August, 2006

JON W. DUDAS

*Director of the United States Patent and Trademark Office*